United States Patent [19]

Gillery et al.

[11] Patent Number: 4,716,086

[45] Date of Patent: Dec. 29, 1987

[54] PROTECTIVE OVERCOAT FOR LOW EMISSIVITY COATED ARTICLE

[75] Inventors: F. Howard Gillery, Allison Park; Russell C. Criss; James J. Finley, both of Pittsburgh, all of Pa.

[73] Assignee: PPG Industries, Inc., Pittsburgh, Pa.

[21] Appl. No.: 812,680

[22] Filed: Dec. 23, 1985

Related U.S. Application Data

[63] Continuation-in-part of Ser. No. 683,458, Dec. 19, 1984, abandoned.

[51] Int. Cl.$^4$ .............................................. B32B 17/06
[52] U.S. Cl. .................................... 428/630; 428/631; 428/632; 428/633; 428/432
[58] Field of Search ............... 428/432, 433, 434, 630, 428/631, 632, 633

[56] References Cited

U.S. PATENT DOCUMENTS

| | | | |
|---|---|---|---|
| Re. 27,473 | 9/1972 | Mauer | 358/2 |
| 4,094,763 | 6/1978 | Gillery et al. | 204/192 P |
| 4,113,599 | 9/1978 | Gillery | 204/192 P |
| 4,166,018 | 8/1979 | Chapin | 204/192 R |
| 4,201,649 | 5/1980 | Gillery | 204/192 P |
| 4,327,967 | 5/1982 | Groth | 350/258 |
| 4,349,425 | 9/1982 | Miyake et al. | 204/192 P |
| 4,462,883 | 7/1984 | Hart | 204/192 C |

Primary Examiner—Christopher W. Brody
Assistant Examiner—George Wyszemierski
Attorney, Agent, or Firm—Donna L. Seidel

[57] ABSTRACT

A multiple layer high transmittance, low emissivity coated article is disclosed with improved chemical resistance as a result of a protective overcoat of titanium oxide.

10 Claims, No Drawings

PROTECTIVE OVERCOAT FOR LOW EMISSIVITY COATED ARTICLE

CROSS-REFERENCE TO RELATED APPLICATION

This application is a continuation-in-part of U.S. Ser. No. 683,458 filed Dec. 19, 1984 by F. Howard Gillery, now abandoned.

BACKGROUND OF THE INVENTION

The present invention relates generally to the art of cathode sputtering of metal oxide films, and more particularly to the art of magnetic sputtering of multiple layer films of metal and metal oxide.

U.S. Pat. No. 4,094,763 to Gillery et al discloses producing transparent, electroconductive articles by cathode sputtering metals such as tin and indium onto refractory substrates such as glass at a temperature above 400° F. in a low pressure atmosphere containing a controlled amount of oxygen.

U.S. Pat. No. 4,113,599 to Gillery teaches a cathode sputtering technique for the reactive deposition of indium oxide in which the flow rate of oxygen is adjusted to maintain a constant discharge current while the flow rate of argon is adjusted to maintain a constant pressure in the sputtering chamber.

U.S. Pat. No. 4,166,018 to Chapin describes a sputtering apparatus in which a magnetic field is formed adjacent a planar sputtering surface, the field comprising arching lines of flux over a closed loop erosion region on the sputtering surface.

U.S. Pat. No. 4,201,649 to Gillery discloses a method for making low resistance indium oxide thin films by first depositing a very thin primer layer of indium oxide at low temperature before heating the substrate to deposit the major thickness of the conductive layer of indium oxide by cathode sputtering at typically high cathode sputtering temperatures.

U.S. Pat. No. 4,327,967 to Groth discloses a heat-reflecting panel having a neutral-color outer appearance comprising a glass pane, an interference film having a refractive index greater than 2 on the glass surface, a heat reflecting gold film over the interference film and a neutralization film of chromium, iron, nickel, titanium or alloys thereof over the gold film.

U.S. Pat. No. 4,349,425 to Miyake et al discloses d-c reactive sputtering of cadmium-tin alloys in argon-oxygen mixtures to form cadmium-tin oxide films having low electrical resistivity and high optical transparency.

U.S. Pat. No. 4,462,883 to Hart discloses a low emissivity coating produced by cathode sputtering a layer of silver, a small amount of metal other than silver, and an anti-reflection layer of metal oxide onto a transparent substrate such as glass. The anti-reflection layer may be tin oxide, titanium oxide, zinc oxide, indium oxide, bismuth oxide or zirconium oxide.

U.S. Pat. No. Re. 27,473 to Mauer discloses a multilayer transparent article comprising a thin layer of gold or copper sandwiched between two layers of transparent material such as various metals, titanium oxide, lead oxide or bismuth oxide.

In the interest of improving the energy efficiency of double-glazed window units it is desirable to provide a coating on one of the glass surfaces which increases the insulating capability of the unit by reducing radiative heat transfer. The coating therefore must have a low emissivity in the infrared wavelength range of the radiation spectrum. For practical reasons, the coating must have a high transmittance in the visible wavelength range. For aesthetic reasons, the coating should have a low luminous reflectance and preferably be essentially colorless.

High transmittance, low emissivity coatings as described above generally comprise a thin metallic layer, for infrared reflectance and low emissivity, sandwiched between dielectric layers of metal oxides to reduce the visible reflectance. These multiple layer films are typically produced by cathode sputtering, especially magnetron sputtering. The metallic layer may be gold or copper, but is generally silver. The metal oxide layers described in the prior art include tin oxide, indium oxide, titanium oxide, bismuth oxide, zinc oxide, zirconium oxide and lead oxide. In some cases, these oxides incorporate small amounts of other metals, such as manganese in bismuth oxide, indium in tin oxide and vice versa, to overcome certain disadvantages such as poor durability or marginal emissivity. However, all of these metal oxides have some deficiency.

Although the coating may be maintained on an interior surface of a double-glazed window unit in use, where it is protected from the elements and environmental agents which would cause its deterioration, a durable effective coating able to withstand handling, packaging, washing and other fabrication processes encountered between manufacture and installation is particularly desirable. These properties are sought in the metal oxide. However, in addition to hardness which provides mechanical durability, inertness which provides chemical durability, and good adhesion to both the glass and the metal layer, the metal oxide should have the following properties as well.

The metal oxide must have a reasonably high refractive index, preferably greater than 2.0, to reduce the reflection of the metallic layer and thus enhance the transmittance of the coated product. The metal oxide must also have minimal absorption to maximize the transmittance of the coated product. For commercial reasons, the metal oxide should be reasonably priced, have a relatively fast deposition rate by magnetron sputtering, and be nontoxic.

Perhaps the most important, and most difficult to satisfy, requirements of the metal oxide film relate to its interaction with the metallic film. The metal oxide film must have low porosity, to protect the underlying metallic film from external agents, and low diffusivity for the metal to maintain the integrity of the separate layers. Finally, and above all, the metal oxide must provide a good nucleation surface for the deposition of the metallic layer, so that a continuous metallic film can be deposited with minimum resistance and maximum transmittance. The characteristics of continuous and discontinuous silver films are described in U.S. Pat. No. 4,462,884 to Gillery et al the disclosure of which is incorporated herein by reference.

Of the metal oxide multiple-layer films in general use, those comprising zinc oxide and bismuth oxide are insufficiently durable, those oxides being soluble in both acid and alkaline agents, with the multiple-layer film being degraded by fingerprints, and destroyed in salt, sulfur dioxide and humidity tests. Indium oxide, preferably doped with tin, is more durable and protective of an underlying metal layer; however, indium sputters slowly and is relatively expensive. Tin oxide, which may be doped with indium or antimony, is also more durable and protective of an underlying metal layer, but does not provide a suitable surface for nucleation of the silver film, resulting in high resistance and low transmittance. The characteristics of a metal oxide film which result in proper nucleation of a subsequently deposited silver film have not been established; however, trial-and-error experimentation has been widely practiced with the metal oxides described above.

U.S. Pat. No. 4,610,771 to Gillery, the disclosure of which is incorporated herein by reference, provides a novel film composition of an oxide of a metal alloy, as well as a novel multiple-layer film of metal and metal alloy oxide layers for use as a high transmittance, low emissivity coating.

SUMMARY OF THE INVENTION

The present invention improves the durability of multiple layer films, especially multiple layer films comprising metal and/or metal alloy oxide layers and metal layers such as silver, by providing an exterior protective layer of a particularly chemical resistant material such as titanium oxide.

DETAILED DESCRIPTION OF THE PREFERRED EMBODIMENTS

A film composition preferably comprising an oxide of a metal or metal alloy is preferably deposited by cathode sputtering, preferably magnetron sputtering. A cathode target is prepared comprising the desired metal or metal alloy elements. The target is then sputtered in a reactive atmosphere, preferably containing oxygen in order to deposit a metal or metal alloy oxide film on a surface of a substrate.

A preferred metal alloy oxide in accordance with the present invention is an oxide of an alloy comprising zinc and tin. A zinc/tin alloy oxide film may be deposited in accordance with the present invention by cathode sputtering, preferably magnetically enhanced. Cathode sputtering is also a preferred method for depositing high transmittance, low emissivity films in accordance with the present invention. Such films typically comprise multiple layers, preferably a layer of a highly reflective metal such as gold or silver sandwiched between anti-reflective metal oxide layers such as indium oxide or titanium oxide, or preferably an oxide of an alloy of zinc and tin which preferably comprises zinc stannate.

While various metal alloys may be sputtered to form metal alloy oxide films, in order to produce a preferred high transmittance, low emissivity multiple layer film in accordance with the present invention, alloys of tin and zinc are preferred. A particularly preferred alloy comprises zinc and tin, preferably in proportions of 10 to 90 percent zinc and 90 to 10 percent tin. A preferred zinc/tin alloy ranges from 30 to 60 percent zinc, preferably having a zinc/tin ratio from 40:60 to 60:40. A most preferred range is 46:54 to 50:50 by weight tin to zinc. A cathode of zinc/tin alloy reactively sputtered in an oxidizing atmosphere results in the deposition of a metal oxide layer comprising zinc, tin and oxygen, preferably comprising zinc stannate, $Zn_2SnO_4$.

In a conventional magnetron sputtering process, a substrate is placed within a coating chamber in facing relation with a cathode having a target surface of the material to be sputtered. Preferred substrates in accordance with the present invention include glass, ceramics and plastics which are not detrimentally affected by the operating conditions of the coating process.

The cathode may be of any conventional design, preferably an elongated rectangular design, connected with a source of electrical potential, and preferably employed in combination with a magnetic field to enhance the sputtering process. At least one cathode target surface comprises a metal alloy such as zinc/tin which is sputtered in a reactive atmosphere to form a metal alloy oxide film. The anode is preferably a symmetrically designed and positioned assembly as taught in U.S. Pat. No. 4,478,702 to Gillery et al, the disclosure of which is incorporated herein by reference.

In a preferred embodiment of the present invention, a multiple layer film is deposited by cathode sputtering to form a high transmittance, low emissivity coating. In addition to the metal alloy target, at least one other cathode target surface comprises a metal to be sputtered to form a reflective metallic layer. At least one additional cathode target surface comprises the metal to be deposited as the primer layer. A durable multiple layer coating having a reflective metallic film in combination with an anti-reflective metal alloy oxide film is produced as follows, using primer layers to improve the adhesion between the metal and metal oxide films.

A clean glass substrate is placed in a coating chamber which is evacuated, preferably to less than $10^{-4}$ torr, more preferably less than $2 \times 10^{-5}$ torr. A selected atmosphere of inert and reactive gases, preferably argon and oxygen, is established in the chamber to a pressure between about $5 \times 10^{-4}$ and $10^{-2}$ torr. A cathode having a target surface of zinc/tin metal alloy is operated over the surface of the substrate to be coated. The target metal is sputtered, reacting with the atmosphere in the chamber to deposit a zinc/tin alloy oxide coating layer on the glass surface.

After the initial layer of zinc/tin alloy oxide is deposited, the coating chamber is evacuated, and an inert atmosphere such as pure argon is established at a pressure between about $5 \times 10^{-4}$ and $10^{-2}$ torr. A cathode having a target surface of a metal such as copper is sputtered to deposit a primer layer over the zinc/tin alloy oxide layer. A cathode having a target surface of silver is then sputtered to deposit a reflective layer of metallic silver over the primer layer which improves the adhesion of the silver film to the underlying metal oxide film. An additional primer layer is then deposited by sputtering a metal such as copper over the reflective silver layer to improve the adhesion between the silver film and the overlying metal oxide film subsequently deposited. Finally, a second layer of zinc/tin alloy oxide is deposited over the second primer layer under essentially the same conditions used to deposit the first zinc/tin alloy oxide layer.

In most preferred embodiments of the present invention, a protective overcoat is deposited over the final metal oxide film. The protective overcoat is preferably deposited by sputtering over the metal oxide film a layer of a metal such as disclosed in U.S. Pat. No. 4,594,137 to Gillery et al. Preferred metals for the protective overcoat include alloys of iron or nickel, such as stainless steel or Inconel. Titanium is a most preferred overcoat because of its high transmittance.

In accordance with the present invention, the chemical resistance of a multiple layer film is most improved by depositing a protective coating comprising titanium oxide over the multiple layer film. Preferably, the titanium oxide protective coating is deposited by cathode sputtering at a relatively high deposition rate and low pressure, preferably about 3 millitorr. A protective coating comprising titanium oxide may be formed by sputtering titanium in an oxygen-sufficient atmosphere to deposit titanium oxide directly. In an alternative embodiment of the present invention, a protective coating comprising titanium oxide may be formed by sputtering titanium in an inert atmosphere to deposit a titanium-containing film which subsequently oxidizes to titanium oxide upon exposure to an oxidizing atmosphere such as air.

The present invention will be further understood from the description of a specific example which follows. In the example, the zinc/tin alloy oxide film is referred to as zinc stannate although the film composition need not be precisely $Zn_2SnO_4$.

EXAMPLE

A multiple layer film is deposited on a soda-lime silica glass substrate to produce a high transmittance, low emissivity coated product. A stationary cathode measuring 5 by 17 inches (12.7 by 43.2 centimeters) comprises a sputtering surface of zinc/tin alloy consisting of 52.4 weight percent zinc and 47.6 percent tin. A soda-lime-silica glass substrate is placed in the coating chamber which is evacuated to establish a pressure of 4 millitorr in an atmosphere of 50/50 argon/oxygen. The cathode is sputtered in a magnetic field at a power of 1.7 kilowatts while the glass is conveyed past the sputtering surface at a rate of 110 inches (2.8 meters) per minute. A film of zinc stannate is deposited on the glass surface. Three passes produce a film thickness of about 340 Angstroms, resulting in a decrease in transmittance from 90 percent for the glass substrate to 83 percent for the zinc stannate coated glass substrate. A stationary cathode with a copper target is then sputtered to produce a copper primer layer over the zinc stannate, reducing the transmittance to about 80.6 percent. Next, a layer of silver is deposited over the copper primer layer by sputtering a silver cathode target in an atmosphere of argon gas at a pressure of 4 millitorr. With the substrate passing under the silver cathode target at the same rate, two passes are necessary to deposit ten micrograms of silver per square centimeter, corresponding to a film thickness of about 90 Angstroms, decreasing the transmittance of the coated substrate to about 70.3 percent. A second copper primer layer is sputtered over the silver layer to improve the adhesion and protect the silver layer before the final anti-reflective layer of zinc stannate is deposited. Since the copper primer layers decrease the transmittance, their thicknesses are preferably minimal. The copper primer layers are deposited by sputtering a copper target at minimum power in argon at a pressure of 4 millitorr. The transmittance of the sample decreases to 68.3 percent after deposition of the second copper primer layer. Next, the zinc/tin alloy cathode target is sputtered in an oxidizing atmosphere to produce a zinc stannate film. Four passes at a rate of 110 inches (2.8 meters) per minute produce a film thickness of about 430 Angstroms, increasing the transmittance of the coated product from 68.3 to 83.2 percent. The multiple-layer coating has a surface resistance of 10 ohms per square and a slightly bluish reflectance from both sides, with a luminous reflectance of 5 percent from the coated side and 6 percent from the uncoated side of the glass. Finally, a stationary titanium cathode measuring 5 by 17 inches (12.7 by 43.2 centimeters) is sputtered at 10 kilowatts in an atmosphere comprising equal volumes of argon and oxygen at a pressure of 3 millitorr. Two passes of the substrate at a speed of 110 inches (2.8 meters) per minute are sufficient to deposit a protective coating of titanium oxide abut 15 to 20 Angstroms thick. The protective coating of titanium oxide does not significantly affect the resistance and reflectance properties of the multiple-layer coating, and changes the transmittance no more than about one percent.

The improved durability of the coated article resulting from the improved adhesion between the metal and metal oxide films as a result of the primer layers of the present invention is readily demonstrated by a simple abrasion test consisting of wiping the coated surface with a damp cloth. A surface coated with zinc stannate/silver/zinc stannate having no primer layers in accordance with the present invention increases in reflectance from about 6 percent to about 18 percent after several passes of a damp cloth, indicating removal of both the top zinc stannate and the underlying silver films. In contrast, prolonged vigorous rubbing with a damp cloth produces no visible change in a zinc stannate/copper/silver/copper/zinc stannate coated article comprising the primer layers of the present invention.

Preferred titanium oxide protective coatings have thicknesses in the range of about 10 to 50 Angstroms. With a titanium oxide protective coating about 20 Angstroms thick, the durability of a multiple layer coating in accordance with this example is increased from 2 hours to 22 hours in a 2½ percent salt solution at ambient temperature, and from 5 hours to one week in the Cleveland humidity test conducted with a Q-Panel Cleveland Condensation Tester Model QCT-ADO containing deionized water at 150° F. (about 66° C.).

The above example is offered to illustrate the present invention. Various modifications of the product and the process are included. For example, other coating compositions are within the scope of the present invention. Depending on the proportions of zinc and tin when a zinc/tin alloy is sputtered, the coating may contain widely varying amounts of zinc oxide and tin oxide in addition to zinc stannate. The adhesion between a wide variety of metal and metal oxide films may be improved by means of primer layers in accordance with the present invention. Since the process does not require very high temperatures, substrates other than glass, such as various plastics, may be coated. A scanning cathode may be used with a stationary substrate. Process parameters such as pressure and concentration of gases may be varied over a broad range. Primer layers may comprise other metals such as indium, or oxides such as copper oxide or indium oxide. Protective coatings of other chemically resistant materials may be deposited in either metal or oxide states. The scope of the present invention is defined by the following claims.

We claim:

1. A high transmittance, low emissivity article comprising:
    a. a transparent nonmetallic substrate;
    b. a first transparent antireflective film comprising a metal oxide deposited on a surface of said substrate;
    c. a transparent infrared reflective metallic film deposited after said first antireflective metal oxide film;
    d. a second transparent antireflective film comprising a metal oxide deposited after said infrared reflective metallic film; and
    e. a protective overcoat about 10 to 50 Angstroms thick deposited after said second antireflective metal oxide film comprising a metal oxide having greater durability than said antireflective metal oxide at the same thickness.

2. An article according to claim 1, wherein the substrate is glass.

3. An article according to claim 2, wherein the reflective metallic film is silver.

4. An article according to claim 3, wherein the antireflective metal oxide film comprises an oxide reaction product of an alloy comprising zinc and tin.

5. An article according to claim 4, wherein the antireflective metal oxide film comprising an oxide reaction product of a metal alloy comprises zinc stannate.

6. An article according to claim 1, which further comprises a primer film deposited between the reflective metallic film and transparent metal oxide antireflective film selected from the group consisting of copper, indium and the oxides thereof.

7. An article according to claim 6, wherein the primer film comprises copper.

8. An article according to claim 1, wherein the protective metal oxide overcoat comprises titanium oxide.

9. An article according to claim 8, wherein the thickness of the titanium oxide overcoat is about 10 to 20 Angstroms.

10. An article according to claim 9, wherein the thickness of the titanium oxide overcoat is about 15 to 20 Angstroms.

* * * * *